United States Patent [19]

Tseng

[11] Patent Number: 5,126,916
[45] Date of Patent: Jun. 30, 1992

[54] STACKED CAPACITOR DRAM CELL AND METHOD OF FABRICATING

[75] Inventor: Horng-Huei Tseng, Hsinchu, Taiwan

[73] Assignee: Industrial Technology Research Institute, Hsinchu, Taiwan

[21] Appl. No.: 810,832

[22] Filed: Dec. 20, 1991

[51] Int. Cl.$^5$ .................. H01G 4/06; H01L 21/70; H02L 29/78
[52] U.S. Cl. ..................... 361/313; 357/23.6; 437/48
[58] Field of Search ................ 361/311–313; 357/23.6, 51; 437/48, 52

[56] References Cited

U.S. PATENT DOCUMENTS

| | | | |
|---|---|---|---|
| 4,700,457 | 10/1987 | Matsukawa | 437/52 |
| 4,742,018 | 5/1988 | Kimura et al. | 437/48 |
| 4,910,566 | 3/1990 | Ema | 357/23.6 |
| 4,914,546 | 4/1990 | Alter | 361/313 |
| 4,951,175 | 8/1990 | Kurosawa et al. | 361/313 |
| 5,028,990 | 7/1991 | Kotaki et al. | 357/23.6 |
| 5,047,817 | 9/1991 | Wakamiya et al. | 357/23.6 |

OTHER PUBLICATIONS

IEEE Spectrum Nov. 1990 Fujio Masuoka pp. 109–112.
IEDM 1988 T. Ema et al. pp. 592–595.

*Primary Examiner*—Donald Griffin
*Attorney, Agent, or Firm*—George O. Saile

[57] ABSTRACT

A DRAM having stacked high capacitance capacitors formed by depositing a thick undoped polysilicon layer over field oxide areas thereon, patterning the polysilicon layer so as to have portions over the planned stacked capacitor areas, forming a silicon oxide layer on the exposed surface of the polysilicon, removing the silicon oxide layer from horizontal surfaces of the polysilicon layer by anisotropic etching, removing the polysilicon layer by isotropic etching leaving vertical silicon oxide structures, and forming openings to desired source/drain structures of the DRAM using lithography and etching. A bottom electrode polysilicon layer is deposited over the device and field oxide areas to make contact to the source/drain structures. A capacitor dielectric layer is formed over the bottom electrode polysilicon layer. A contact polysilicon layer is deposited as the top storage node electrode and the contact polysilicon layer and the dielectric layers are patterned.

18 Claims, 4 Drawing Sheets

STACKED CAPACITOR DRAM CELL AND METHOD OF FABRICATING

RELATED PATENT APPLICATIONS (1) U.S. patent application Ser. No. 07/811,991 filed Dec. 23, 1991 by the same inventor H. H. Tseng entitled "SELF-ALIGNED CYLINDRICAL STACKED CAPACITOR DRAM CELL".

(2) U.S. Patent application Ser. No. 07/811,537 filed Dec. 20 ,1991 by the same inventor H. H. Tseng entitled "DYNAMIC RANDOM ACCESS MEMORY WITH FIN-TYPE STACKED CAPACITORS".

BACKGROUND OF THE INVENTION

(1) FIELD OF THE INVENTION

The present invention relates to methods of fabricating a dynamic random access memory having a high capacitance stacked capacitor.

(2) DESCRIPTION OF THE PRIOR ART

In recent years there has been a dramatic increase in the packing density of DRAMs. Large DRAM devices are normally silicon based, and each cell typically embodies a single MOS field effect transistor with its source connected to a storage capcitor. This large integration of DRAMs has been accomplished by a reduction in individual cell size. However, a decrease in storage capacitance, which results from the reduction in cell size, leads to draw backs, such as a lowering source/drain ratio and undesirable signal problems in terms of reliability. In order to achieve the desired higher leve of integration, it requires the technology to keep almost the same storage capacitance on a greatly reduced cell area.

Efforts to maintain or increase the storage capacitance in memory cells with greater packing densities in the fabrication of stacked capacitors are evident in T. Ema U.S. Pat. No. 4,910,566: S. Kimura et al U.S. Pat. No. 4,742,018 and T. Matsukawa U.S. Pat. No. 4,700.457. The publications "Are you ready for next-generation dynamic RAM chips?" by F. Masuoka pages 109–112, IEEE Spectrum, Nov. 1990, and T. Ema et al "3-DIMENSIONAL STACKED CAPACITOR CELL FOR 16M AND 64M DRAMS" IEDM 1988 pages 592–595 describe the problems and possible types capacitor structures for future generations of dynamic RAMs. Another approach to achieve sufficient capacitance in high density memories is the use of a stacked trench capacitor cella s described in copending U.S. patent application of Wen doe Su entitled "FABRICATION OF MEMORY CELL WITH AN IMPROVED CAPACITOR" Ser. No. 07/568,945 filed Aug. 17, 1990.

It is well known that in the art of integrated circuit device manufacture, one of the primary goals is increasing the number of device that can be placed into a given unit space onthe semicondcutor chip. As the traditional fabrication process begin to approach the limit of reduction, considerable attention has been applied to forming device elements on over and above the wafer to take advantage of extra verstility of third dimension.

One of the successful vertically oriented integrated circuit devices is the stacked capacitor. Briefly, such a stacked capacitor is formed by forming the stacked capacitor structures laying over the gate electrode on active and fiedl oxide regions and diffusion region. The processing of such structures have become very complicated and require lithogrpahy and etching steps whch are not in step with the very small dimensions requird in the present and future state of the art. Although there has been much work done in accomplishing these small size devices and increased capacitance therein, there is still great need for devices with even greater capacitance for a give space in order to achieve even greater packing densities, and improve the DRAM products of the furture.

SUMMARY OF THE INVENTION

Accordingly, it is a primary object of the invention to provide a process for producing a memory cell and resulting structure with a stacked capcitor haivng greater capactiance per unit area and by a very simplified manufacturable process.

A method is described for fabricating a dynamic random access memory having a high capacitance stacked capacitor. The method begins by selectively forming relatively thick field oxide ares on the surface of a semiconductor substrate while leaving device areas for fabrication fo field effect devices. A gate dielectric layer is formed on the substrate in the device areas. A relatively thick first layer of polysilicon is deposited on the field oxide areas and the drvice areas. Portions of the first polysilicon layer are removed while leaving portions thereof for the gate structure in the device areas, and portions over the field oxide areas. Source/drain structures are formed within the device areas of said semiconductor substrate associated with the gate stuctures. A first insualtor layer composed at least in part of silicon nitride is formed over the device and field oxide areas. The stacked capacitors are now formed by first depositing a thick second and undoped polysilicon layer over the device and field oxide areas. The second poysilicon layer is patterned so as to have its remaining portions over the planned stacked capacitor areas. The exposed surfaces of the second polysilicon layer are oxidized to from a silicon oxide layer on its surface. The silicon oxide layer is removed from the horizontal surfaces of the second polysilicon layer by anisotropic etching. The second polysilicon layer is removed by isotropic etching leaving the vertical silicon oxide structures. Openings are formed to the desired source/drain structures through the first insualtor layer using lithography and etching techiniques. The bottom electrode polysilicon layer is deposited over the device and field oxide areas to make contact to the source/drain structures. The bottom electrode is patterned. A capacitor dielectric layer is formed over the bottom electrode polysilicon layer. A contact polysilicon layer is deposited as the top storage node electrode and the contact polysilicon layer, and said dielectric layer is patterned to complete said stacked capacitors.

A dynamic random access memory having a high capacitance stacked capacitor is described. Relatively thick field oxide areas are located on the surface of a semiconductor substrate which surround device areas for fabrication of field effect devices. Gate dielectric and electrode structure are on the substrate in the device areas. An interconnecting line composed of polysilicon layer are located over the field oxide areas. Source/drain structures are within the device areas of the semiconductor substrate associated with the gate structures. A first insulator layer composed at least in part of silicon nitride is located over the device and field oxide areas. The stacked capacitors structure ar constructed of a cylindrical shell-like structure composed of a core of silicon oxide which has portions based upon the gate electrod and interconnection line structures. A lower electrode completing polysilicon layer is formed over the surfaces of the core of silicon oxide and electrically contacting the source/drain structures to complete the lower electrode of the stacked capacitor. A capacitor dielectric layer over the lower electrode of the stacked capacitor. A top polysilicon electrode layer completes the stacked capacitor.

DESCRIPION OF THE PREFERRED EMBODIMENTS

Figure 1:
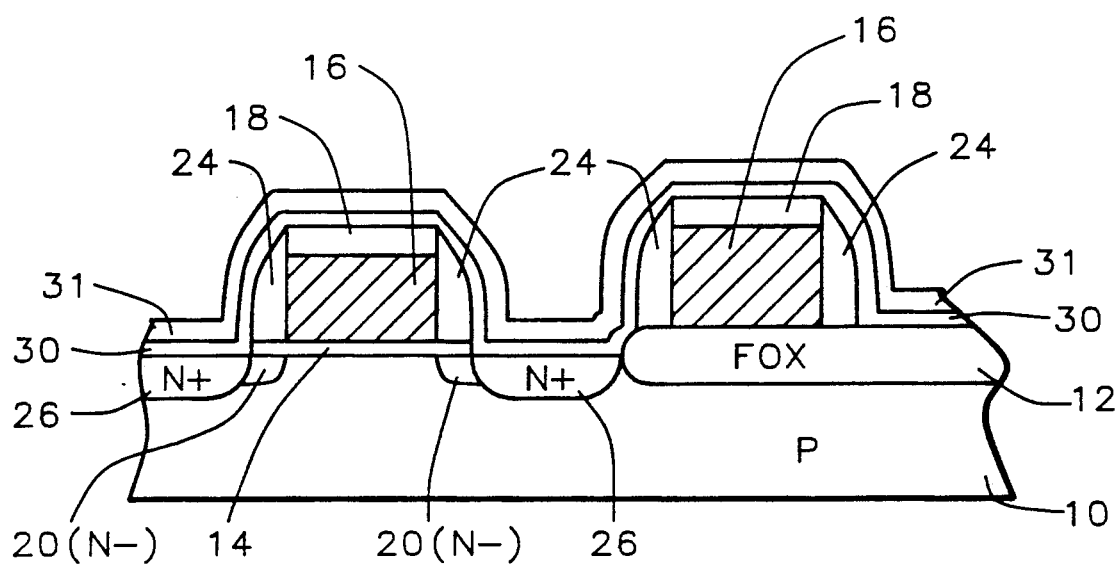
FIGS. 1 though 6 is a schematic cross-sectional representation of an embodiment method for fabricating a stacked capacitor in combinaiton with a field effect device which is usable in a DRM cell.

Referring now more particularly to FIGS. 1 through 6 there is shown an embodiment of the method for fabricating a self-aligned, cylindrical stacked capacitor and field effect device structure. The first series of steps involve the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 where in certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field Oxide pattern, FOX 12. Then semiconductor devices can be provided in the silicon mesas according to the following processes.

The surface of the silicon substrate 10 is thermally oxidized to form the desired gate oxide 14 thickness. The preferred thickness is between about 80 to 200 Angstroms. The polysilicon layer 16 is blanket deposited by LPCVD (Low Pressue Chemical Vapor Depositon) method. The preferred thickness of the first polysilicon layer 16 is between about 1500 to 4000 Angrstroms. The polysilicon layer 16 is ion implanted with phosphorous or arsenic ions under the conditoins 5 to 10 E 15 dosage per area and 20 to 60 Kev. or doped with phosphorus oxychloride at a temperature about 900° C. A surface silicon oxide or glass layer 18 is formed on the polysilicon layer 16. The layers 14, 16 and 18 are patterned by conventional lithography and anisotropic etching techniques as are conventional in the art to provide a desired pattern of gate electrodes and interconnection runners on the FOX 12 surfaces or elsewhere as seen in FIG. 1.

The source/drain structure of the MOS FET may now be formed by the following steps. The FIG. 1 illustrates the formation of an N channel FET integrated circuit device. However, it is well understood by those skilled in the art that a P channel FEt integrated circuit device could also be formed by simply substituting opposite polarities to those given for the N channel embodiment. Also, a CMOS FET could in a similar way be formed by making both N channel and P chan-nel devices upon the same substrate. As is understood in the art, the DRAM cell is composed of a combination device structure of an N channel FET and a stacked capacitor while the peripheral circuits are often composed of CMOS devices.

FIG. 1, for example shows the ion implantations of N- dopants. Lithographic masks may be required to protect the areas not to be subjected to that particular N- ion implantation. The formation of the lithographic masks are done by conventional lithography and etchin techniques. The N- lightly doped drain implantation 20 is done with, for example phosphorous P31 at a dose of between about 1 to 10 E 13 atoms/cm.$^2$ and an energy of between about 20 to 40 Kev.

The dielectric spacer 24 is now to be formed followed by the completion of the lightly doped drain source/drain structures. A low temperature silicon oxide deposition is preferred such as throught he chemical vapor deposition of tetraethoxysilane (TEOS) at a temperature in the range of between about 650° to 900° C. Other silicon oxide depositoin methods include silane based LPCVD. The thickness of the dielectric silicon dioxide layer 24 is between about 2000 to 5000 Angstroms and preferably about 2500 Angstroms.

An anisotropic etching of this layer produces the dielectric spacer layer 24 on the sidewalls of the layer structures 14, 15, 18. The preferred anisotropic etching uses a conventional reactive ion etching ambient.

A thin silicon oxide, silicon nitride or the like maskin layer (not shown) is usually formed upon the layer structure regions 14, 16, 18, the spacers 24 and the exposed monocrystalline silicon substrate regions to protect the surfaces from ion implantation damage. The conditions for forming this layer are LPCVD deposition of TEOS or LPCVD silicon nitride depositon at about 600° to 900° C. The preferred thickness of this oxide layer is between about 200 to 1000 Angstroms and a preferred thickness of about 600 Angstroms.

The N+ source/drain ion implantation uses Arsenic, As75 with a does of between about 2 E 15 to 1 E 16 atoms/cm.$^2$ and energy of between about 20 to 70 Kev. to complete the source/drain regions 26 of the N channel lightly doped drain MOS FET integrated circuits device as seen in the FIG. 1.

A first insulator layer is formed over the field oxide and device areas. This layer is composed at least in part of silicon nitride for future etch stop or oxidation stop needs. The layer is typically composed of a layer 30 of silicon oxide and a lyer 31 of silicon oxide and silocn nitride. These silicon oxide layers are formed by LPXVD at a temperature of 720° C.; pressure of 200 to 300 mTorr.; and gas of $Si(CH_3)_4$, $N_2O$ and oxygen. The silicon nitride layer is formed by LPCVD at a temperature of 760° C.; pressure of 350 mTorr.; and gas of $SiH_2Cl_2$ and ammonia. The thickness of the layer 30 is between about 200 to 400 Angstroms and the thickness of the layer 31 is between about 400 to 800 Angstroms for the slicon oxide portion and between about 300 to 600 Angstroms for the silicon nitride portion. FIG. 1 is now completed.

Figure 2:
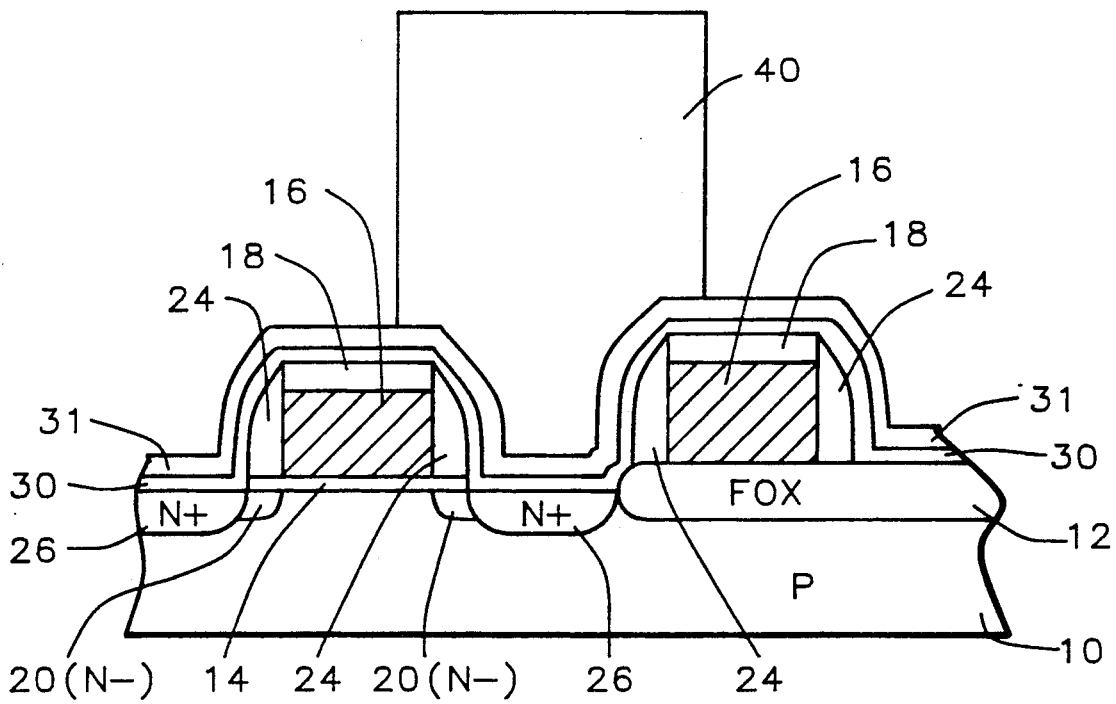
Figure 3:
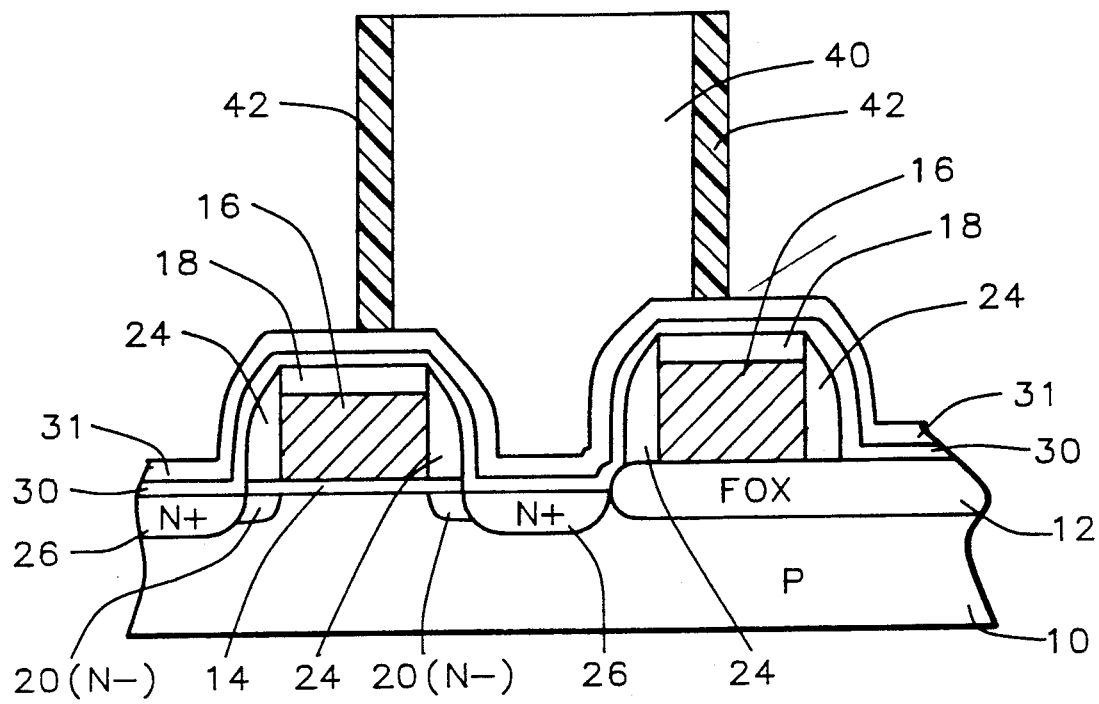
Figure 4:
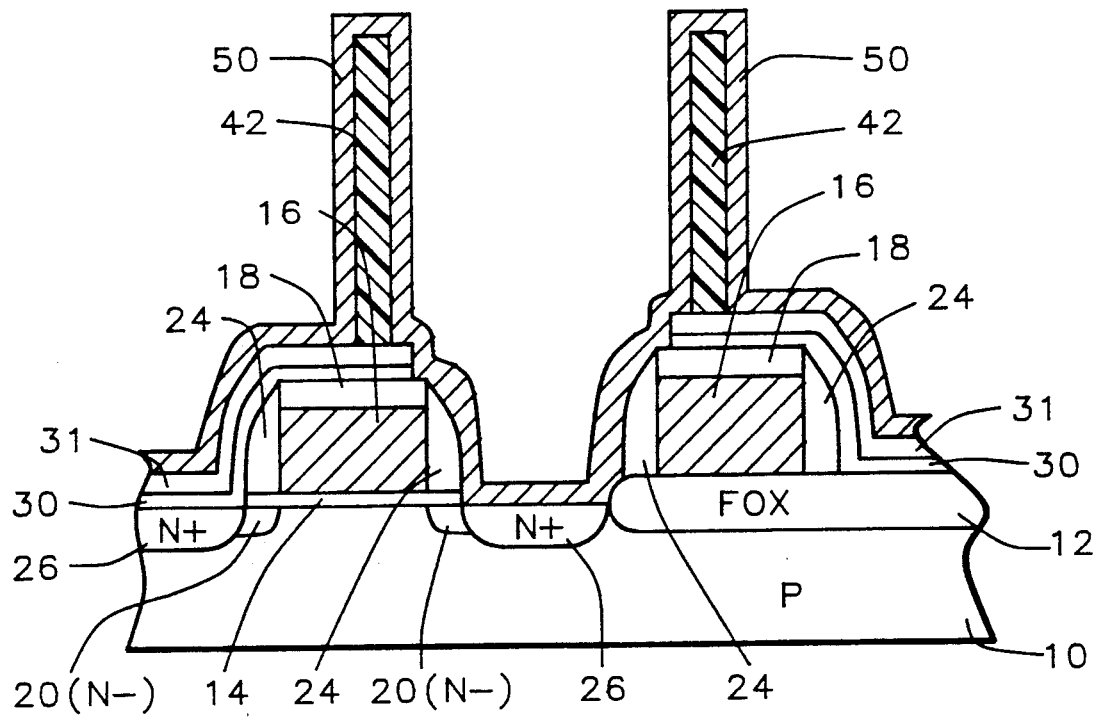
Figure 5:
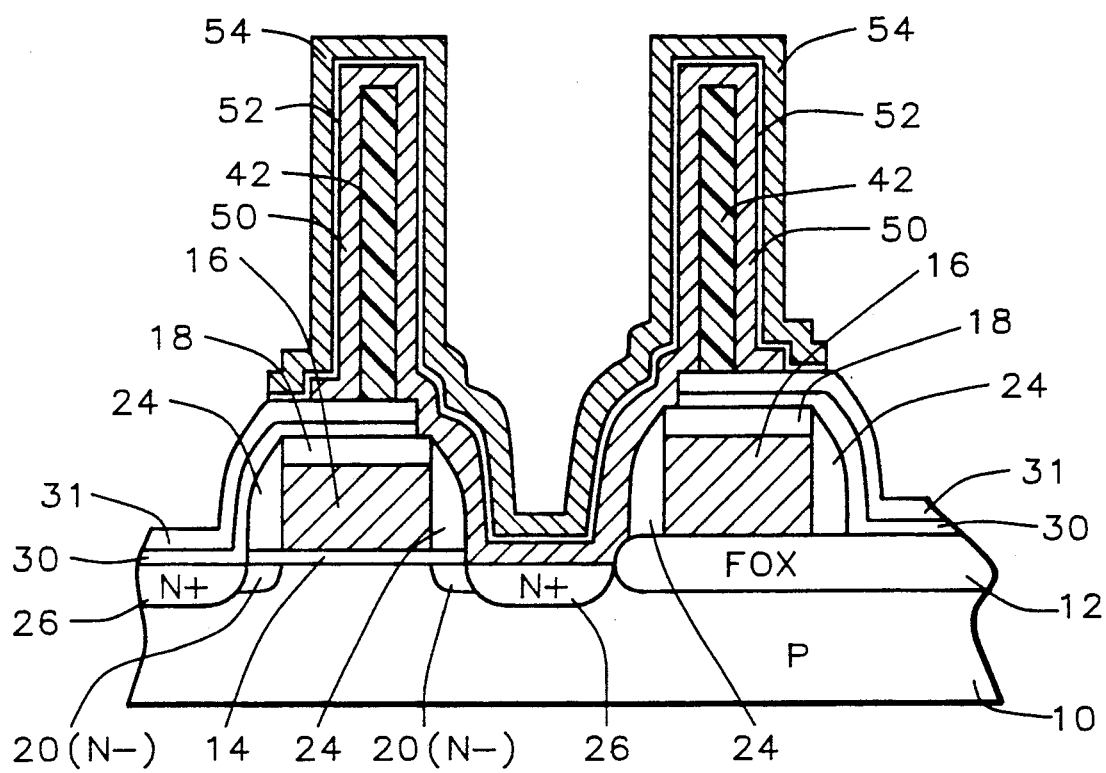

Referring now more particularly to FIGS. 2 and 3, there is shown the technique for making this silicon oxide core of the stacked capacitor. An undoped polysilicon layer 40 is deposited over the filed oxide and device areas. The layer is thick and is preferably in thickness between about 3000 to 8000 Angstroms. It is deposited by LPCVD at a temperature of 620° C., pressure of 300 mTorr., and silane process gas. The polysilicon layer 40 is patterned by lithography and etching techniques so as to have its remaining portions over the planned stacked capacitor areas. The exposed surfaces of the polysilicon layer 40 are now deposited by LPCVD as described above or by thermally oxidized by in wet oxygen at 900° C. to product the silicon oxie layer 42 over the vertical and horizontal surfaces thereof having a thickness between about 1000 to 3000 Angstroms. The horizontal portions of the silicon oxide layer 42 are removed by an anisotropic etching method as using an reactive ion etching (RIE) or magnetic enhanced RIE (MERIE) tool. For example, using the PR5000E MERIE manufactured by Applied Material Co., the typical process uses a power of 550 Watts; magnetic field of 80 gauss; pressure of 150 mTorr.; and gas flow of $CF_4$-4 sccm., $CHF_3$-40 sccm., and Argon 40 sccm.; to give an etch rate of about 3000 Angstroms per minute. This results in the FIG. 3 structure.

The polysilicon layer 40 is now removed by an isotropic etching process as follows in a LAM 490 Plasma Etchng tool mantufactured by Lam Research Co. wherein pressure is 200 to 400 mTorr.; power 150 Watts; and process gas is oxygen, chlorine and helium; to give an etch rate of about 6000 Angstroms per minute.

A resist mask (not shown) is formed by lithography and etching techniques to allow for the patterning of the first insulator layer 30, 31 to make openings in this layer 30, 31 for the self-aligned electrical contact to the needed source/drain structures of the device areas while protecting the silicon oxide vertical structures 42. Suitable etching will remove the exposed layer 30, 31. The resist layer is then removed.

The bottom or lower capacitor electrode is completed by the deposition of a contact polysilicon layer 50 over the device and field oxide areas. The contact polyisilicon layer 50 also makes electrical contact with the needed source/drain structures of the device areas. This polysilicon layer is deposited by LPCVD in-situ phosphorus doped process and has a thickness of between about 300 to 1500 Angstroms. The process conditions for this LPCVD process are temperature of 570° C.; pressure of 200 to 300 mTorr.; process gases of (15% $pH_3$ and 85% silane) and (5% $PH_3$ and 95% nitrogen). The mixed gas (15% $PH_3$ and 85% silane) is to fine-control dopant concentration between wafers. This layer is patterned by lithography and etching techniques.

The capacitor dielectric layer 52 is now formed over the polysilicon layer 50 which is in turn over the core of silicon oxide 42. The layer is typically either composed of layers of silicon nitride and silicon oxide (NO) or layers of silicon oxide, silicon nitride and silicon oxide (ONO). In making the ONO dielectric, the first or bottom silicon oxide, O layer is formed by, for example exposure to deionized water (DI) to form a native silicon oxide or by thermal oxidization of layer 50 in dry oxygen ambient to produce in either case a silicon oxide thickness of about 50 Angstroms. The silicon nitride, N layer is formed by LPCVD wherein the gases are ammonia and $SiH_2Cl_2$, temperature of 760° C., pressure of 350 mTorr., to give a resulting thickness of between about 50 to 70 Angstroms. The top silicon oxide, O layer may be formed by exposing the N layer to dry oxygen at about 850° C. for about 30 minutes to form a silicon nitride/oxide layer. The total ONO thickness is in the order of 100 to 200 Angstroms.

The top storage node electrode is formed by depositing third polysilicon layer 54 by in-situ deposition using silane as described in regard to layer 50 above. The thickness of this layer 54 is between about 1000 to 3000 Angstroms. The layer 54 is now patterned using conventional lithography and etching techniques to produce the FIG. 5 structure.

Figure 6:
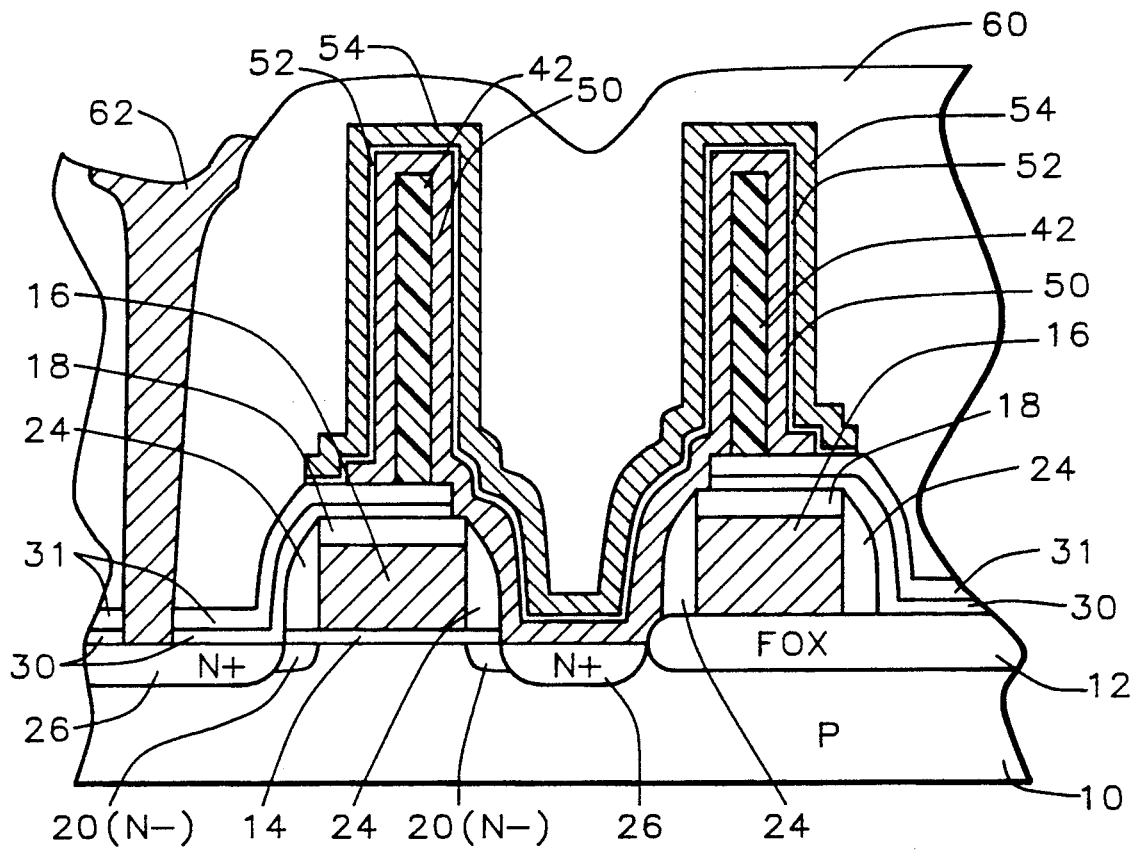

The final structure is shown with the next level of electrical connections to the FET and stacked capacitor cell of the DRAM integrated circuit is shown in FIG. 6 wherein insulator layer 60 has been deposited over the field oxide and device areas and a electrical contact is made to the source/drain 26 using a metallurgy via 62. The layer 60 is a thick layer in the range of 3000 to 6000 Angstroms or more and can preferably be planarized by heat flow or by etching. The layer 60 can be for example a phosphosilicate, glass, a borophosphosilicate glass, a silicon oxide-spin-on-glass-silicon oxide sandwich, or the like. Lithography and etching techniques are used to form the desired openings to a bit line contact. The desired contact metallurgy 62 is deposited and patterned as is known in the art. Higher levels of metallurgy (not shown) can in turn be formed over the metal level 62. For example, a higher level of metallurgy contact to top capacitor electrode (not shown) is necessary.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory having a high capacitance stacked capacitor comprising:

selectively forming relatively thick field oxide areas on the surface of a semiconductor substrate while leaving device areas for fabrication of field effect devices;

forming a gate dielectric layer on said substrate in the said device areas;

depositing a relatively thick first layer of polysilicon on the said field oxide areas and said device areas;

removing portions of said first polysilicon layer while leaving portions thereof for the gate structure in said device areas, and portions over said field oxide areas;

forming source/drain structures within said device areas of said semiconductor substrate associated with said gate structures;

forming a first insulator layer composed at least in part of silicon nitride over said device and field oxide areas; and forming said stacked capacitors by, depositing an undoped second polysilicon layer over the device and field oxide areas, patterning said second polysilicon layer so as to have its remaining portions over the planned said stacked capacitor areas, forming a silicon oxide layer on the exposed surfaces of said second polysilicon layer, removing said silicon oxide layer from the horizontal surfaces of said second polysilicon layer, removing by isotropic etching said second polysilicon layer, forming openings to said desired source/drain structures through said first insulator layer using lithography techniques, depositing the bottom electrode polysilicon layer over said device and field oxide areas, forming a capacitor dielectric layer over the said bottom electrode polysilicon layer, and depositing a contact polysilicon layer as the top storage node electrode, and patterning said contact polysilicon layer, and said dielectric layer.

2. The method of claim 1 wherein the thickness of said first polysilicon layer is between about 1500 to 4000 Angstroms.

3. The method of claim 1 wherein the composition of said first insulator layer is a layer of silicon oxide and silicon nitride wherein the total thickness is between about 900 to 1800 Angstroms.

4. The method of claim 1 wherein the thickness of said second polysilicon layer is between about 3000 to 8000 Angstroms.

5. The method of claim 1 wherein the thickness of said silicon oxide formed on the exposed surfaces of said second polysilicon layer is between about 1000 to 3000 Angstroms.

6. The method of claim 5 wherein said silicon oxide layer has a height of between about 2000 to 7000 Angstroms and forms the base of a cylindrical shell-shaped said stacked capacitor.

7. The method of claim 1 wherein said capacitor dielectric is composed of layers of silicon oxide, silicon nitride and silicon oxide.

8. A method for fabricating a high capacitance stacked capacitor comprising:

selectively forming relatively thick field oxide areas on the surface of a semiconductor substrate while leaving device areas for fabrication of semiconductor devices;

forming device structures within said device areas of said semiconductor substrate;

forming a first insulator layer composed at least in part of silicon nitride over said device and field oxide area; and forming said stacked capacitors by, depositing an undoped polysilicon layer over the device and field oxide areas, patterning said polysilicon layer so as to have its remaining portions over the planned said stacked capacitor areas, forming a silicon oxide layer on the exposed surfaces of said second polysilicon layer, removing said silicon oxide layer from the horizontal surfaces of said polysilicon layer, removing by isotropic etching said polysilicon layer, forming openings to said desired source/drain structures through said first insulator layer using lithography techniques, depositing the bottom electrode polysilicon layer over said device and field oxide areas, forming a capacitor dielectric layer over the said bottom electrode polysilicon layer, and depositing a contact polysilicon layer as the top storage node electrode, and patterning said contact polysilicon layer and said dielectric layer to complete said stacked capacitors.

9. The method of claim 8 wherein said device structures in said device areas are source/drain and gate field effect transistor structures which form a dynamic random access memory cell together with said stacked capacitor.

10. The method of claim 8 wherein the composition of said first insulator layer is a layer of silicon nitride and silicon oxide wherein the total thickness is between about 900 to 1800 Angstroms.

11. The method of claim 8 wherein the thickness of said polysilicon layer is between about 3000 to 8000 Angstroms.

12. The method of claim 8 wherein the thickness of said silicon oxide formed on the exposed surfaces of said polysilicon layer is between about 1000 to 3000 Angstroms.

13. The method of claim 12 wherein said silicon oxide layer has a height of between about 2000 to 7000 Angstroms and forms the base of a cylindrical shell-shaped said stacked capacitor.

14. The method of claim 8 wherein said capacitor dielectric is composed of layers of silicon oxide, silicon nitride and silicon oxide.

15. A dynamic random access memory having a high capacitance stacked capacitor comprising:

relatively thick field oxide areas on the surface of a semiconductor substrate which surround device areas for fabrication of field effect devices;

gate dielectric and electrode structure on said substrate in the said device areas;

an interconnecting line composed of polysilicon layer over said field oxide areas;

source/drain structures within said device areas of said semiconductor substrate associated with said gate structures;

a first insulator layer composed at least in part of silicon nitride over said device and field oxide areas; and said stacked capacitors structure constructed of, a cylindrical shell-like structure composed of a core of silicon oxide which has portions based upon said gate electrode and interconnection line structures, a lower electrode completing polysilicon layer over the surfaces of said core of silicon oxide and electrically contacting said source/drain structures to complete the lower electrode of said stacked capacitor, a capacitor dielectric layer over the said lower electrode of said stacked capacitor, and a top polysilicon electrode layer to complete said stacked capacitors.

16. The memory of claim 15 wherein the thickness of said core of silicon oxide is between about 1000 to 3000 Angstroms.

17. The memory of claim 16 wherein said silicon oxide layer has a height of between about 2000 to 7000 Angstroms and forms the base of a cylindrical shell-shaped said stacked capacitor.

18. The memory of claim 15 wherein said capacitor dielectric is composed of layers of silicon oxide, silicon nitride and silicon oxide.

* * * * *